(12) United States Patent
Schultz et al.

(10) Patent No.: US 12,004,322 B2
(45) Date of Patent: Jun. 4, 2024

(54) COLD PLATE WITH UNIFORM PLENUM FLOW

(71) Applicant: International Business Machines Corporation, Armonk, NY (US)

(72) Inventors: Mark D. Schultz, Ossining, NY (US); Pritish Ranjan Parida, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 17/134,383

(22) Filed: Dec. 26, 2020

(65) Prior Publication Data

US 2022/0210946 A1  Jun. 30, 2022

(51) Int. Cl.
| | |
|---|---|
| *H05K 7/20* | (2006.01) |
| *B33Y 80/00* | (2015.01) |
| *F28F 3/12* | (2006.01) |
| *H01L 23/473* | (2006.01) |

(52) U.S. Cl.
CPC ........... *H05K 7/20254* (2013.01); *F28F 3/12* (2013.01); *H01L 23/473* (2013.01); *B33Y 80/00* (2014.12)

(58) Field of Classification Search
CPC ..... H05K 7/20254; F28F 3/12; H01L 23/473; B33Y 80/00
USPC ...................................................... 165/80.4
See application file for complete search history.

(56) References Cited

U.S. PATENT DOCUMENTS

| | | | |
|---|---|---|---|
| 5,393,617 A * | 2/1995 | Klein ...................... | H01M 4/24 429/153 |
| 5,832,736 A | 11/1998 | Yoshioka | |
| 5,983,997 A | 11/1999 | Hou | |
| 6,924,981 B2 | 8/2005 | Chu et al. | |
| 7,277,283 B2 * | 10/2007 | Campbell ........... | H01L 23/4735 165/80.4 |
| 7,367,386 B2 | 5/2008 | Sato et al. | |
| 7,545,648 B2 | 6/2009 | Karidis | |
| 8,017,279 B2 * | 9/2011 | Hood .................. | H01M 8/0273 429/457 |
| 8,999,548 B2 | 4/2015 | Sun et al. | |
| 9,425,124 B2 | 8/2016 | Karidis | |

(Continued)

FOREIGN PATENT DOCUMENTS

| | | |
|---|---|---|
| CN | 103841804 A | 6/2014 |
| CN | 107086337 B | 8/2017 |

(Continued)

OTHER PUBLICATIONS

European Patent Office as ISA, related International application PCT/ EP2021/084557, ISR and Written Opinion, 28 pages total, dated Apr. 7, 2022.

(Continued)

*Primary Examiner* — Claire E Rojohn, III

(74) *Attorney, Agent, or Firm* — Daniel Morris; Otterstedt & Kammer PLLC

(57) ABSTRACT

A cold plate apparatus includes walls that surround an active volume adjacent to an inlet plenum; the walls include an inlet opening at one end of a top side of the inlet plenum and a plenum opening between the inlet plenum and the active volume. Also included is a blocker that partially separates the inlet plenum from the active volume. The blocker is structurally configured to preferentially redirect flow from the inlet plenum into the active volume.

9 Claims, 4 Drawing Sheets

(56) References Cited

U.S. PATENT DOCUMENTS

| | | |
|---|---|---|
| 9,894,801 B1 | 2/2018 | Marroquin et al. |
| 9,939,210 B2 | 4/2018 | Schultz |
| 9,997,435 B2 | 6/2018 | Karidis |
| 10,085,362 B2 | 9/2018 | Chainer et al. |
| 10,109,898 B2 | 10/2018 | Gruenwald et al. |
| 10,326,119 B2* | 6/2019 | Obrist ................. H01M 50/209 |
| 10,727,159 B2 | 7/2020 | Brunschwiler et al. |
| 2007/0000650 A1 | 1/2007 | Nishimura |
| 2007/0062681 A1 | 3/2007 | Beech |
| 2008/0166277 A1 | 7/2008 | Son |
| 2012/0097368 A1* | 4/2012 | Chen ....................... F28F 13/08 |
| | | 165/104.21 |
| 2012/0201005 A1 | 8/2012 | Barringer et al. |
| 2014/0043765 A1 | 2/2014 | Gohara et al. |
| 2014/0054762 A1* | 2/2014 | Nagaune ............... H01L 23/473 |
| | | 257/714 |
| 2014/0162107 A1* | 6/2014 | Obrist ................. H01M 10/617 |
| | | 165/46 |
| 2014/0196871 A1 | 7/2014 | Otsuka et al. |
| 2016/0343640 A1* | 11/2016 | Gohara .............. H05K 7/20927 |
| 2016/0343694 A1 | 11/2016 | Lin |
| 2018/0098459 A1* | 4/2018 | Chainer ............. H05K 7/20272 |
| 2019/0221499 A1 | 7/2019 | Chang |
| 2020/0027819 A1 | 1/2020 | Smith |
| 2020/0214176 A1 | 7/2020 | Tokeshi |
| 2022/0205740 A1* | 6/2022 | Schultz .............. H05K 7/20272 |
| 2022/0210946 A1* | 6/2022 | Schultz .............. H05K 7/20254 |
| 2022/0377940 A1* | 11/2022 | Yang ........................ G06F 1/20 |

FOREIGN PATENT DOCUMENTS

| | | |
|---|---|---|
| CN | 107248507 A | 10/2017 |
| CN | 208285719 U | 12/2018 |
| CN | 109950656 A | 6/2019 |
| DE | 60 2006 000 470 T2 | 1/2009 |
| DE | 10 2014 202 542 A1 | 8/2015 |
| DE | 10 2017 216 598 A1 | 3/2019 |
| DE | 11 2017 005 475 T5 | 7/2019 |
| DE | 10 2019 008 611 A1 | 10/2020 |
| EP | 2744034 B1 | 6/2014 |
| EP | 3352216 A1 | 7/2018 |
| JP | 2016012616 A | 1/2016 |

OTHER PUBLICATIONS

Sarangan et al., An experimental study of heat transfer and pressure drop characteristics of divergent wavy minichannels using nanofluids. Heat and Mass Transfer. 1;53(3):959-71 Jul. 2016.

Duan et al., Pressure drop of impingement air cooled plate fin heat sinks, pp. 1-6, Jun. 2007.

Harrison, IBM Appendix P, pp. 1-2, Dec. 2020.

Schultz, Reduced Pressure Drop Cold Plate Transition, U.S. Appl. No. 17/134,387, pp. 1-46, Dec. 2020.

German Patent and Trade Mark Office, counterpart German application 10 2021 130 964.6, Office Action dated Jun. 23, 2022, 6 pages.

Intellectual Property Office of the United Kingdom, Combined Search and Examination Report GB2117486.7, 6 pages total, dated May 16, 2022.

\* cited by examiner

COLD PLATE WITH UNIFORM PLENUM FLOW

BACKGROUND

The present invention relates to the electrical, electronic, thermal, mechanical, and computer arts, and more specifically, to apparatus for cooling computer components.

One type of apparatus for cooling computer components is the "cold plate," which is a conductive heat sink placed in contact with a component either directly or with intervening thermal interface material (TIM). A cold plate can be a solid block of metal, often with fins for enhanced air cooling; or it can be a hollow structure through which a coolant (e.g., water) flows from an inlet to an outlet.

Generally, it is desirable in a heat exchanger to provide plenums on each side of an active (e.g., finned) volume of the heat exchanger; the plenums are sufficiently wide and thick to establish uniform pressure (isobaric) conditions that produce substantially uniform flow through the active area. However, in a typical cold plate application, plenum size is constrained by the size and spacing of components to be cooled. Often, cold plate plenums are not sufficiently large to establish conditions close enough to isobaric to result in the desired uniformity of flow.

SUMMARY

Principles of the invention provide techniques for tuning cold plate plenum transitions.

According to one aspect, an exemplary cold plate apparatus comprises walls that surround an active volume adjacent to an inlet plenum, and a blocker that partially separates the inlet plenum from the active volume. The walls include an inlet opening at one end of the inlet plenum and a plenum opening between the inlet plenum and the active volume. The blocker is structurally configured to preferentially redirect flow from the inlet plenum into the active volume.

According to another aspect, an exemplary cold plate apparatus comprises a top portion that has an inlet opening through it; a bottom portion that surrounds an active volume and an inlet plenum at one side of the active volume, wherein the inlet plenum overlaps the inlet opening; and a deflector that protrudes from an outer wall of the inlet plenum toward the active volume. In some cases, the deflector near a bottom surface of the inlet plenum may protrude closer to the inlet opening than does the deflector near a top surface of the inlet plenum.

According to another aspect, an exemplary cold plate apparatus comprises a top plate that has an inlet opening through it; a bottom plate; and a stack of N intermediate plates that are sandwiched between the top and bottom plates and attached to each other and to the top and bottom plates, each intermediate plate having a central opening, the central openings of the stack of intermediate plates overlapping to define an interior volume that is enclosed by the top plate, the bottom plate, and the intermediate plates. The interior volume includes an active volume, an inlet plenum at one side of the active volume, and an inlet opening overlapping the inlet plenum. This aspect also comprises a deflector that protrudes from an outer wall of the inlet plenum toward the active volume. The deflector near the bottom plate protrudes further toward the active volume than does the deflector near the top plate, so that at a lowest intermediate plate the deflector protrudes a distance P from the outer wall of the inlet plenum and at an uppermost intermediate plate the deflector protrudes a second distance P/N from the outer wall of the inlet plenum, and at each intermediate plate ascending from the lowest plate to the uppermost plate, the deflector protrudes P/N less far.

According to another aspect, a cold plate apparatus is constructed by an exemplary process that comprises obtaining an initial cold plate design that includes an active volume, an inlet plenum adjacent to the active volume and connected to the active volume through a plenum opening, and an inlet opening that overlaps the inlet plenum; performing computational fluid dynamics analysis of the initial cold plate design; identifying simulated flow in a first segment of the active volume, proximate the inlet opening, that is greater than simulated flow in a second segment of the active volume, distal from the inlet opening; and generating a revised cold plate design by introducing into the initial cold plate design a blocker that partially separates the inlet plenum from the active volume. The blocker blocks the full or a portion of the full height of the plenum opening adjacent the inlet opening and blocks a diminishing portion of the height of the plenum opening proceeding away from the inlet opening along the plenum opening. The blocker blocks more of the plenum opening near a bottom side of the plenum opening than is blocked near a top side of the plenum opening. Further steps include performing computational fluid dynamics analysis of the revised cold plate design; identifying that simulated flow in the first segment and simulated flow in the second segment are within ten percent of a mean flow across the plenum opening; and fabricating the cold plate apparatus according to the revised cold plate design.

According to another aspect, a method of enhancing flow uniformity through an active volume of a cold plate apparatus comprises introducing coolant into an inlet plenum of the cold plate apparatus through an inlet opening of the cold plate apparatus; blocking a portion of the coolant from flowing into a first segment of the active volume from the inlet plenum, wherein the first segment is proximate to the inlet opening; and deflecting a portion of the coolant to flow into a second segment of the active volume from the inlet plenum, wherein the second segment is downstream from the first segment along the inlet plenum.

In view of the foregoing, techniques of the present invention can provide substantial beneficial technical effects. For example, one or more embodiments provide one or more of:

Enhanced flow profile through an active volume of the cold plate.

Enhanced heat transfer within an active volume of the cold plate.

Improved flow homogeneity through an active volume of the cold plate.

These and other features and advantages of the present invention will become apparent from the following detailed description of illustrative embodiments thereof, which is to be read in connection with the accompanying drawings.

DETAILED DESCRIPTION

Figure 1:
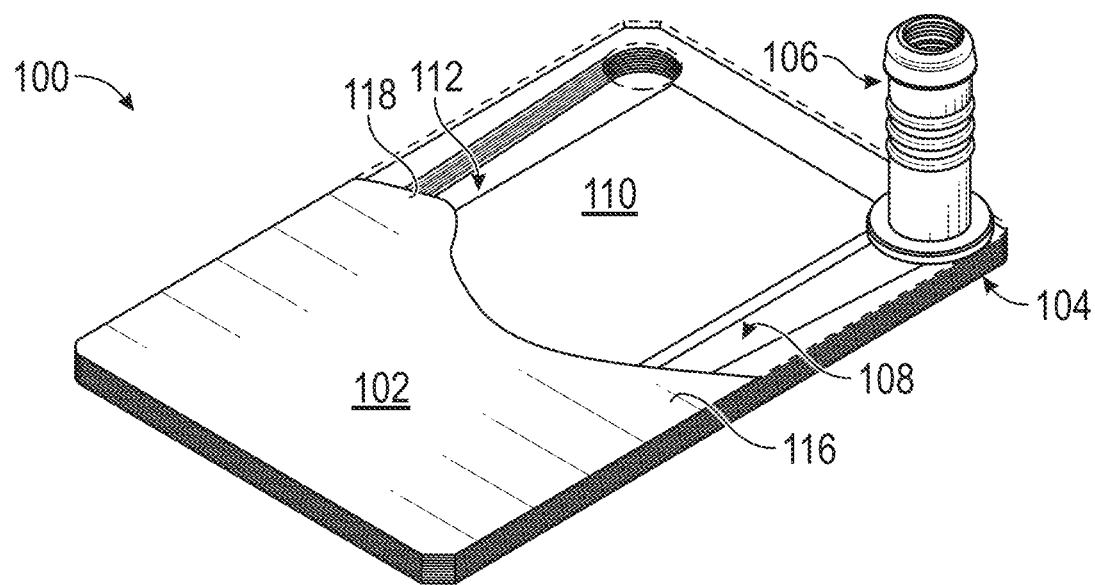
FIG. 1 depicts a cutaway view of a cold plate, according to the prior art.

FIG. 1 depicts a cutaway view of a prior-art cold plate 100 that includes a top portion 102 and a bottom portion 104, to which an inlet nozzle 106 and an outlet nozzle (not shown to avoid clutter) are connected at the top portion. The top portion 102 and the bottom portion 104 enclose an inlet plenum 108, an active volume 110, and an outlet plenum 112. Note the smooth continuous planar outer walls 116, 118 of the inlet and outlet plenums 108, 112. Note, also, the openness of the active volume 110 along the entire length of the inlet and outlet plenums 108, 112. Individual features such as fins, pins, or mesh are present within the active volume 110, but not shown in order to avoid clutter; as would be appreciated by the skilled artisan, the individual features of the active volume define routes for fluid to flow from inlet plenum 108 to outlet plenum 112, and typically provide extended surfaces to enhance heat transfer.

In conventional cold plates, flow from an inlet of the cold plate, which usually enters through a top surface of the inlet plenum at a substantial angle from the length of the inlet plenum (e.g., an angle greater than 70°), impinges on a bottom surface of the inlet plenum and "splashes" in such a way that coolant flow through an active volume of the cold plate becomes non-uniform. For example, in a conventional cold plate the coolant flow rushes into a first segment of the active volume near the inlet opening, partially bypasses a second segment of the active volume downstream of the first segment, and then enters a third segment of the active volume downstream from the second segment.

Embodiments of the present invention advantageously remedy at least some of this flow non-uniformity, i.e., improve homogeneity of flow through the active volume, by providing: (i) a flow blocker near the inlet opening, which mitigates excess flow through a first segment of the active volume; and (ii) a flow deflector proximate to (in some embodiments, slightly upstream from) the second segment of the active volume, which enhances flow through the second segment.

Figure 2:
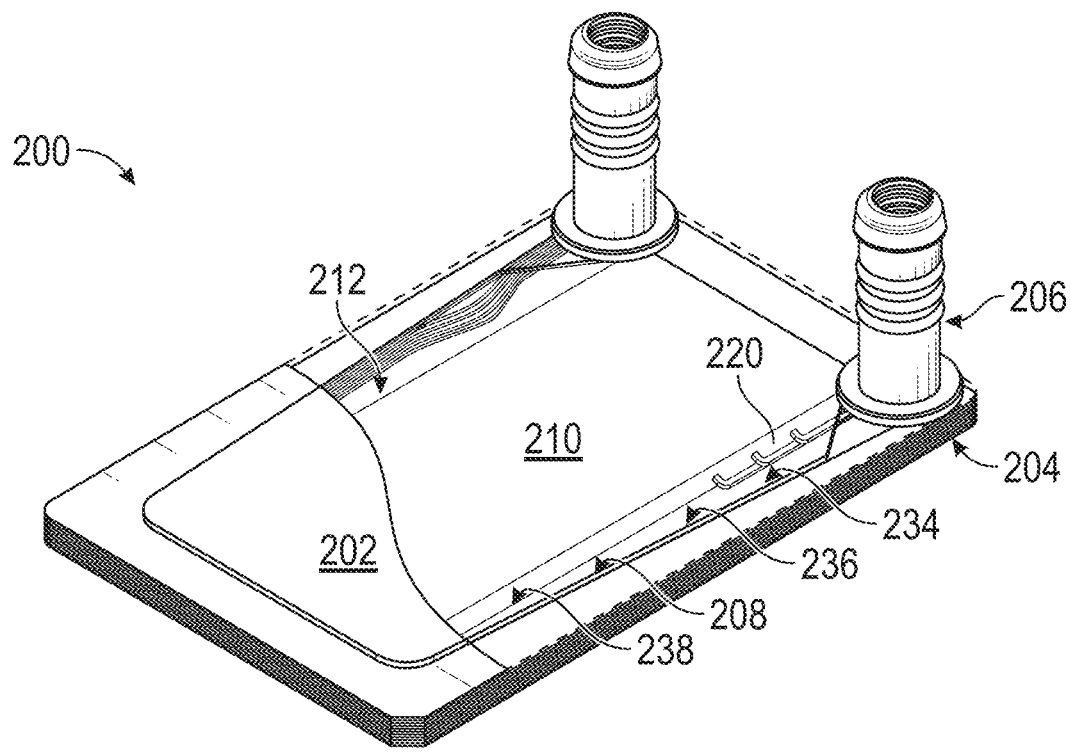
FIG. 2 depicts a first cutaway view of a cold plate with a tuned plenum according to an exemplary embodiment.

FIG. 2 depicts a first cutaway view of a cold plate 200 with walls that include a top portion 202 and a bottom portion 204, which enclose a tuned inlet plenum 208 that opens onto an active volume 210, which in turn opens to an outlet plenum 212. Individual features such as fins, pins, or mesh are not shown within the active volume 210, to avoid clutter; as would be appreciated by the skilled artisan, such features define routes for fluid to flow from inlet plenum 208 to outlet plenum 212, and typically provide extended surfaces to enhance heat transfer. The top portion 202 may be a single plate or billet or a plurality of stacked plates while the bottom portion 204 may be a single plate or billet or a plurality of stacked plates 230 (further described with reference to FIG. 5). An inlet nozzle 206 connects to the inlet plenum 208 through the top portion 202. In one or more embodiments, the outlet plenum 212 is symmetric with the inlet plenum 208 so that flow through the cold plate 200 may be conveniently reversed without diminishing the efficacy of the exemplary cold plate. In one or more embodiments, a blocker 220 (further described with reference to FIG. 3) is positioned in a plenum opening 221 (see FIG. 3) between a portion of the inlet plenum 208 and a portion of the active volume 210. The inlet plenum 208 includes a first region 234, a second region 236, and a third region 238. In normal operation, the third region is downstream from the second region and the second region is downstream from the first region.

Figure 3:
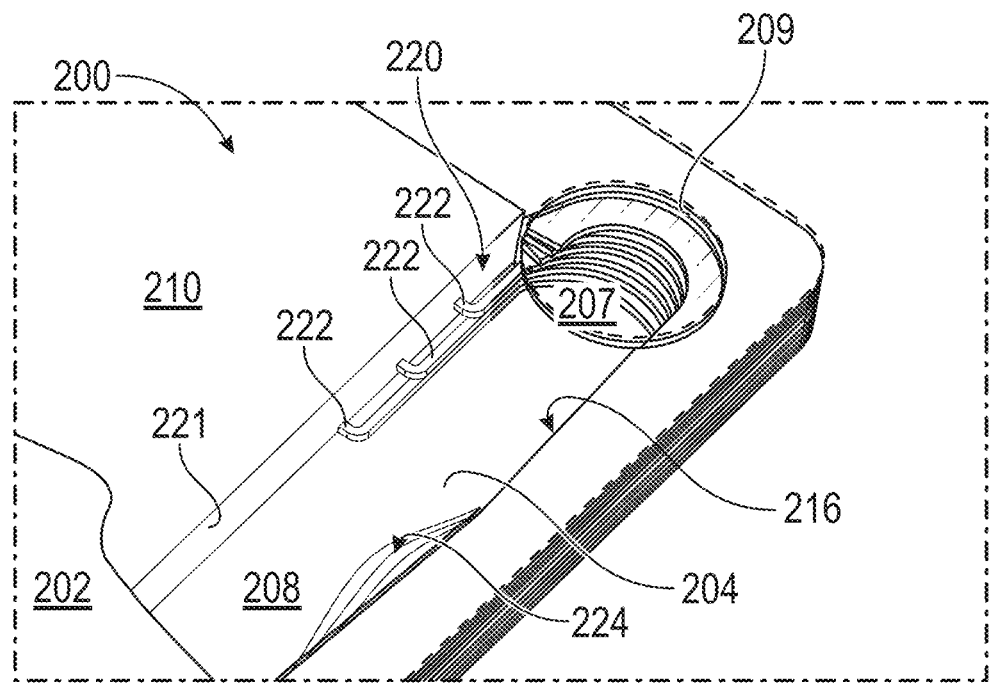
FIG. 3 depicts a second cutaway view of the cold plate shown in FIG. 2.
Figure 4:
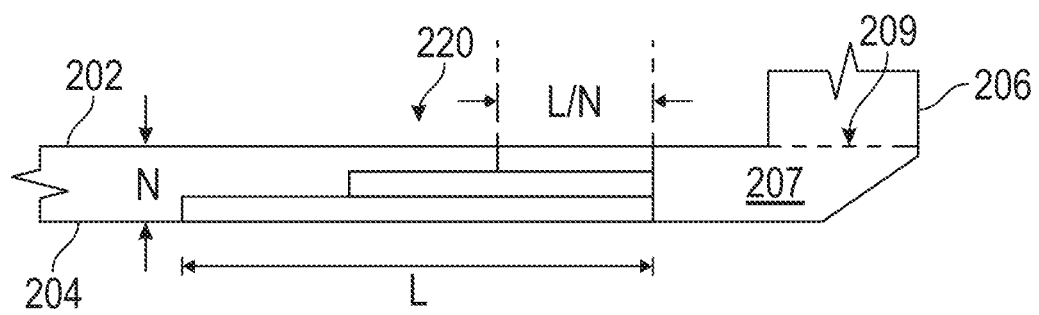
FIG. 4 depicts certain dimensions of a flow blocker shown in FIG. 3.

Referring also to FIG. 3, which depicts a second cutaway view of the cold plate 200, an inlet opening 209 is formed in the top portion 202 for receiving the inlet nozzle (206, shown in FIG. 2). The blocker 220 partially separates the inlet plenum 208 from the active volume 210. The blocker 220 is disposed adjacent to an inlet transition 207, to which the inlet nozzle (206, shown in FIG. 2) ordinarily is attached through the inlet opening 209. The blocker is structurally configured to preferentially redirect flow from the inlet plenum into the active volume, so that flow "splashing" against a bottom surface of the inlet plenum from the inlet opening does not go too much into a first segment of the active volume near the inlet opening and too little into a second segment of the active volume further from the inlet opening. For example, in one or more embodiments the blocker 220 is structurally configured to preferentially redirect flow in that it includes a plurality of fingers 222 of differing lengths, with fingers near the top portion 202 or top surface of the inlet plenum 208 being shorter (extending less far from the inlet transition 207) than are fingers near the bottom plate 204 or bottom surface of the inlet plenum 208. For example, in one or more embodiments (as shown in FIG. 4), where a lowest finger is length L, a reduction of length from each lower finger to a next higher finger is (L/number of fingers N) so that for three fingers, each higher finger is shorter by ⅓ the length of the longest/lowest finger with the highest finger being L/N or ⅓ the length of the lowest finger. One effect of the differing finger lengths is that the blocker 220 near the top portion 202 is less restrictive of flow into the active volume 210 than it is near the bottom portion 204. In operation of the cold plate 200, coolant flow near the bottom portion 204 has higher velocity toward the active volume 210 than does coolant flow near the top portion 202 because the impingement of the incoming flow from the nozzle onto the bottom surface of the inlet plenum can generate high velocity flow along that surface. This flow can force more coolant into the active area near the nozzle than is desired, particularly near the bottom surface of the inlet plenum. Generally, the blocker 220 helps direct this high velocity coolant flow away from a first region of the active volume 210 that is nearest to the inlet transition 207, and downstream along the inlet plenum 208 toward regions 236 and 238 of the active volume 210 that could otherwise be "flow starved."

In one or more embodiments, dimensions of the blocker 220 are obtained by performing a computational fluid dynamic (CFD) analysis of flow from the inlet plenum 208 into the active volume 210, using CFD software starting at a predetermined initial mesh density (e.g., at least 100 elements across the plenum opening 221 in the finite element computational mesh). In one or more embodiments, the mesh size is reduced (i.e., more, smaller elements) until maximum and minimum velocity values obtained with a smaller mesh size remain within 5% of values obtained with a next larger mesh size. Dimensions of the blocker are varied until the CFD analysis produces uniformity of flow across the plenum opening within a predetermined percentage (e.g., 10%) of the mean flow through the plenum opening 221. The skilled artisan will be familiar with suitable CFD software such as, by way of example and not limitation, ANSYS FLUENT or ANSYS CFX software available from Ansys, Inc., Canonsburg, Pennsylvania, USA. The skilled artisan is familiar with constructing suitable meshes for finite element analysis, with appropriate types of elements and mesh fineness, including more mesh detail in areas of higher flow gradient, and of iteratively arriving at a suitable mesh size.

Figure 5:
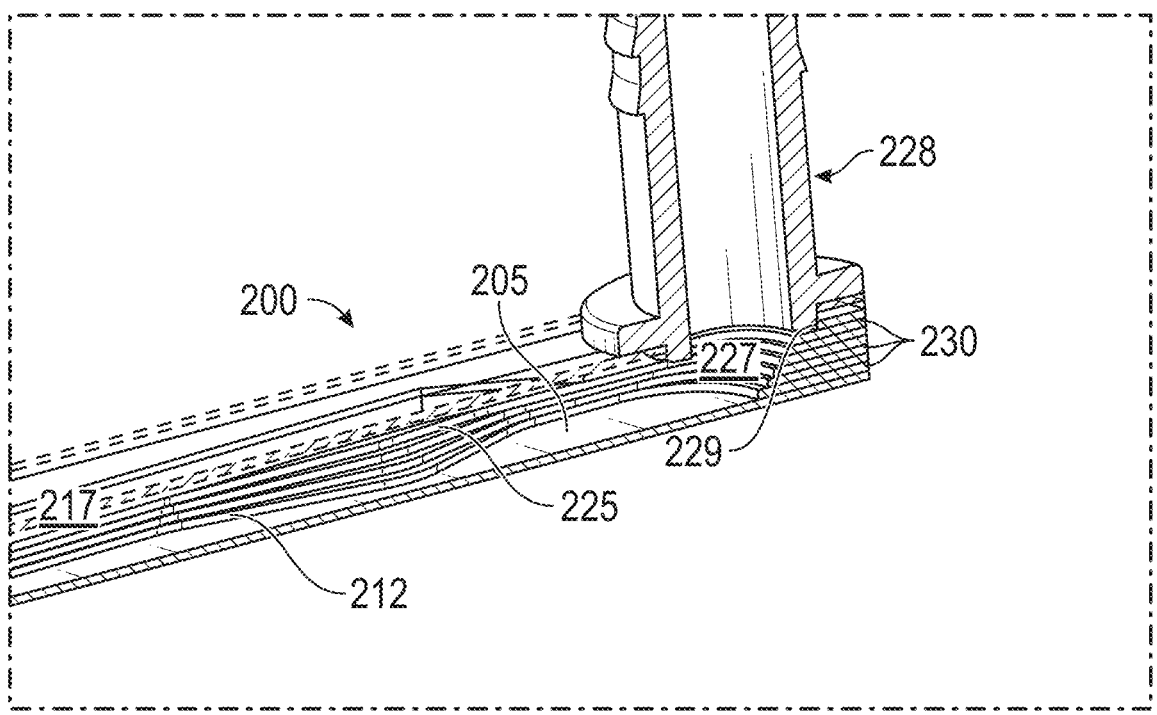
FIG. 5 depicts a third cutaway view of the cold plate shown in FIG. 2 and FIG. 3.

Referring still to FIG. 3, an outer wall 216 of the inlet plenum 208 includes a deflector 224 that protrudes from the outer wall toward the active volume 210, generally aligned near the second region of the active volume. Referring also now to FIG. 5, in one or more embodiments, an outer wall 217 of the outlet plenum 212 includes a deflector 225. This outlet deflector 225 guides flow from the active volume 210 (seen in FIGS. 2 and 3) into an outlet transition 227, which leads to an outlet nozzle 228 via an outlet opening 229.

Figure 6:
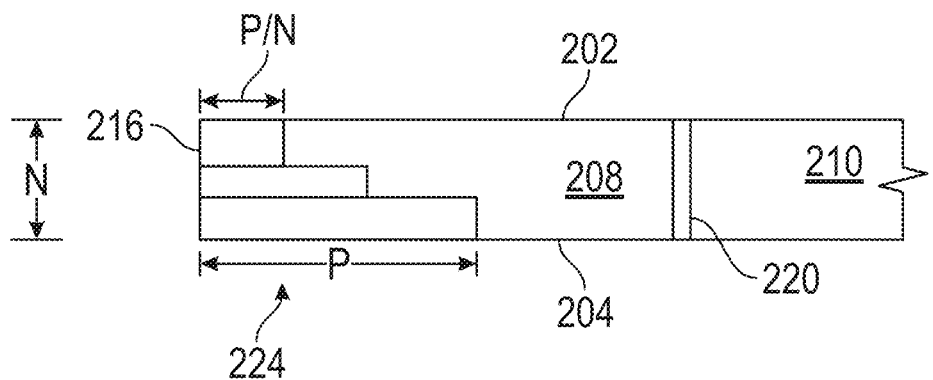
FIG. 6 depicts certain dimensions of a flow deflector shown in FIG. 5.
Figure 7:
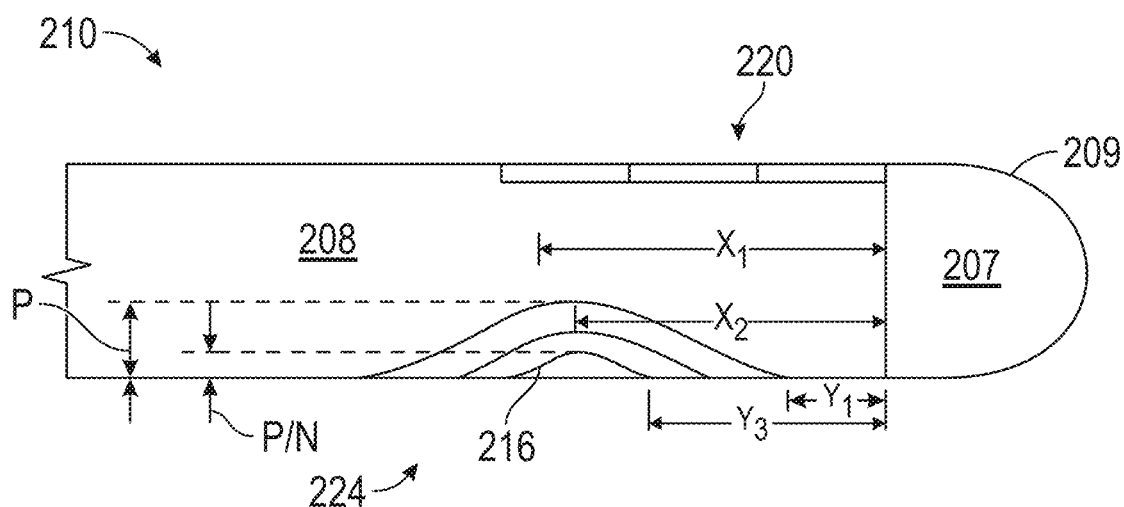
FIG. 7 depicts certain dimensions of the flow deflector shown in FIG. 5.

Referring again to FIG. 3, in one or more embodiments the deflector 224 protrudes further toward the active volume 210 near the bottom plate 204 or bottom surface of the inlet plenum, and less far toward the active volume near the top plate 202 or top surface of the inlet plenum. For example, in one or more embodiments (as shown in FIG. 6), the distance of protrusion varies linearly according to height of the deflector 224, with the lowest point protruding a distance P and the highest point protruding a distance (P/N) where N is the distance in layers or dimensional units from bottom to top of the deflector. Thus, in one or more embodiments the deflector 224 has a sloped face toward the active volume 210. This is again associated with the higher velocity flow located near the bottom surface. However, in one or more embodiments the deflector 224 protrudes the same distance toward the active volume throughout its height, thus, it is not sloped. In one or more embodiments, the maximum protrusion of the deflector 224 may be spaced from the inlet transition 207 in proportion to the size of the protrusion, so that a larger part of the deflector protrudes further from the inlet transition. That is, (as shown in FIG. 7), the deflector 224 at each layer i may protrude at a distance $X_i$ from the centerline of the inlet opening 209, wherein $X_i$ is proportional to $P_i$. However, in one or more embodiments, a maximum protrusion of the deflector 224 is at the same distance from the inlet transition 207 at each level no matter how much the maximum protrusion is. Thus, in one or more embodiments, the maximum protrusion of the deflector 224 is at the same distance from the inlet transition 207 near the top portion 202 as it is near the bottom portion 204.

In one or more embodiments, where the deflector 224 protrudes further toward the active volume 210, the deflector begins its protrusion nearer to the inlet transition 207. Thus, the deflector 224 extends closer to the inlet transition 207 near the bottom portion 204 than it does near the top portion 202. For example, in one or more embodiments, a distance $Y_i$ from a centerline of the inlet opening 209 to a beginning of the deflector 224, at each layer i of the deflector, varies proportional to $(P-P_i/P)$ where $P_i$ is the distance by which the deflector 224 protrudes at layer i and P is the maximum distance of protrusion from the outer wall of the inlet plenum 208.

Referring again to FIG. 5, in one or more embodiments, the cold plate 200 between the top plate 202 and the bottom plate 204 is built of intermediate layers 230, each of which is between 0.25 millimeter (mm) and 0.5 mm (e.g., about 0.3 mm) thick. In one or more embodiments there are six intermediate layers 230, so that the interior height of the cold plate 200 is between 1.5 mm and 3.0 mm (e.g., about 1.8 mm) deep while the cold plate 200 is between 2.0 mm and 4.0 mm (e.g., about 2.5 mm) thick. In one or more embodiments, the cold plate 200 includes an extended surface (e.g., pins, fins, or mesh) within the active volume 210. For example, in one or more embodiments, the cold plate 200 has vertical fins in the active volume 210, which is formed by cutouts of the intermediate layers 230 or by machining or forming into extensions of the bottom plate 204. Any suitable extended surface can be employed; fins are omitted from the drawings to avoid clutter but generally extend (generally vertically) from the top and bottom plates and define flow channels between the plenums.

Given the discussion thus far, it will be appreciated that, in general terms, an exemplary cold plate apparatus, according to an aspect of the invention, includes a top plate 202 that has an inlet opening 209 through it; a bottom plate 204; and a stack of intermediate plates 230 that are sandwiched between the top and bottom plates and attached to each other and to the top and bottom plates. Each intermediate plate has cutouts that define an inlet plenum 208 and an outlet plenum 212 that are enclosed by the top plate, the bottom plate, and the intermediate plates. The interior volume 205 includes an active volume 210, an inlet plenum 208 at one side of the active volume, and an inlet transition 207 overlapping the inlet opening. The exemplary apparatus 200 also includes a blocker 220 that separates the inlet plenum 208 from the active volume 210, wherein the blocker comprises a plurality of fingers 222 at different levels of the stack, and the fingers higher in the stack provide less separation than do the fingers lower in the stack. Other approaches can be used besides a stack of plates, such as machining, 3-D printing techniques and the like, in which case the "steps" noted in the plates may be "smoothed out."

In one or more embodiments, the exemplary apparatus also includes a deflector 224 that protrudes from an outer wall 216 of the inlet plenum 208 toward the active volume 210. In one or more embodiments, the deflector near the bottom plate 204 protrudes closer to the inlet transition 207 than does the deflector near the top plate 202. In one or more embodiments, the deflector near the bottom plate protrudes further toward the active volume 210 than does the deflector near the top plate.

In one or more embodiments, the inlet plenum in normal operation encloses a first region 234 immediately adjacent to the inlet transition, a second region 236 downstream from the first region, and a third region 238 downstream from the second region. The deflector 224 is in the second region 236, where it promotes flow of coolant toward the active volume 210.

In one or more embodiments, each intermediate plate 230 is between 0.2 and 0.5 millimeter (mm) thick and the interior volume 205 is between 1.5 and 3.0 mm deep.

According to another aspect, an exemplary cold plate apparatus 200 includes a top plate that has an inlet opening 209 through it; a bottom plate 204; and a stack of intermediate plates 230 that are sandwiched between the top and bottom plates and attached to each other and to the top and bottom plates. Each intermediate plate has a central opening. The central openings of the stack of intermediate plates overlap to define an interior volume 205 that is enclosed by the top plate, the bottom plate, and the intermediate plates. The interior volume 205 includes an active volume 210, an inlet plenum 208 at one side of the active volume, and an inlet transition 207 overlapping the inlet opening. A deflector 224 protrudes from an outer wall 216 of the inlet plenum 208 toward the active volume 210. The deflector 224 near the bottom plate 204 protrudes closer to the inlet transition 207 than does the deflector near the top plate 202. In one or more embodiments, the deflector near the bottom plate protrudes further toward the active volume than does the deflector near the top plate. In one or more embodiments, the apparatus also includes a blocker 220 that separates the inlet plenum 208 from the active volume 210. The blocker includes a plurality of fingers 222 at different levels of the stack, and the fingers higher in the stack restrict flow less than do the fingers lower in the stack.

According to another aspect, an exemplary cold plate apparatus includes a top portion that has an inlet opening through it and a bottom portion that surrounds an interior volume that is enclosed by the top portion. In some embodiments, the top and bottom portions may be fabricated integrally, e.g., by three-dimensional printing or other additive manufacturing. In other embodiments, the bottom portion may comprise a plurality of stacked plates, i.e., a bottom plate and one or more intermediate plates. The interior volume includes an active volume, an inlet plenum at one side of the active volume, and an inlet transition at overlapping the inlet opening. The inlet plenum includes a deflector that protrudes from an outer wall of the inlet plenum toward the active volume, wherein the deflector protrudes further toward the active volume near the bottom of the interior volume than it does near the top plate. The inlet plenum in normal operation encloses a first region immediately adjacent to the inlet transition, a second region downstream from the first region, and a third region downstream from the second region.

In one or more embodiments, the deflector protrudes closer to the inlet transition near the bottom of the interior volume than it does near the top plate. In one or more embodiments, the interior volume is between 1.5 and 3.0 millimeter (mm) deep.

The "top" plate in one or more embodiments should be understood for a given plenum area as the plate where the nozzle enters. While, in some cases, both nozzles enter the same plate, that is not required. In fact, the nozzle may enter the end of the cold plate as well, or the nozzles can enter opposite plates.

According to another aspect, an exemplary cold plate apparatus surrounds an interior volume. The interior volume includes an active volume, an inlet plenum at one side of the active volume, and an inlet opening overlapping the inlet plenum. A blocker restricts flow from the inlet plenum into the active volume. The portion of the blocker near the top plate restricts flow less than does the portion further from the top plate.

In one or more embodiments, the exemplary apparatus also includes a deflector that protrudes from an outer wall of the inner plenum toward the active volume. The deflector protrudes further toward the active volume near the bottom of the interior volume than it does near the top plate. In one or more embodiments, the deflector protrudes nearer to the inlet transition near the bottom of the interior volume than it does near the top plate.

According to another aspect, an exemplary cold plate apparatus comprises walls that surround an active volume adjacent to an inlet plenum, and a blocker that partially separates the inlet plenum from the active volume. The walls include an inlet opening at one end of the inlet plenum and a plenum opening between the inlet plenum and the active volume. The blocker is structurally configured for preferentially redirecting flow from the inlet plenum into the active volume. In one or more embodiments, the blocker blocks more of the plenum opening near a bottom side of the plenum opening than is blocked near a top side of the plenum opening and/or blocks more of the plenum opening at the end of the inlet plenum near the inlet opening than is blocked further from the inlet opening or the blocker blocks more of the plenum opening near the inlet opening than is blocked further from the inlet opening and blocks more of the plenum opening near a bottom side of the plenum opening than is blocked near a top side of the plenum opening.

In one or more embodiments, the blocker comprises a plurality of N fingers extending from the inlet opening along the inlet plenum, a lowest finger being longest and an uppermost finger being shortest. In one or more embodiments, the lowest finger is a length L, the uppermost finger is a length L/N, and each finger ascending from lowest to uppermost is L/N shorter than a next lower finger.

In one or more embodiments, the blocker comprises a plurality of fingers extending from a bottom side of the plenum opening toward a top side of the plenum opening, a finger closest to the inlet opening being longest and a finger furthest from the inlet opening being shortest. In one or more embodiments, each finger is separated from a neighboring finger by a gap.

In one or more embodiments, the blocker separates the inlet plenum from the active volume across at least ten percent of a segment of the plenum opening, wherein the segment is at least ten percent of the area of the plenum opening. In one or more embodiments, the blocker separates the inlet plenum from the active volume across at least thirty percent of the segment of the plenum opening.

The blocker may be continuous. The blocker may be divided into segments. The blocker may include perforations.

One or more embodiments also comprise a deflector that protrudes from an outer wall of the inlet plenum toward the active volume. In one or more embodiments, the deflector near a bottom surface of the inlet plenum protrudes closer to the inlet opening than does the deflector near a top surface of the inlet plenum. In one or more embodiments, the deflector near a bottom surface of the inlet plenum protrudes further toward the active volume than does the deflector near a top surface of the inlet plenum. In one or more embodiments, the deflector adjacent to the bottom surface protrudes a distance P and the deflector adjacent to the top surface protrudes a distance P/N, wherein N is a measure of the height of the inlet plenum. In one or more embodiments, the inlet plenum in normal operation encloses a first region immediately adjacent to the inlet opening, a second region downstream from the first region, and a third region downstream from the second region, and the deflector is in the second region.

In one or more embodiments, the walls comprise a top plate, a bottom plate, and a stack of intermediate plates between the top plate and the bottom plate, wherein each intermediate plate is between 0.2 and 0.5 millimeter (mm) thick and the interior volume is between 1.5 and 3.0 mm deep. The "top" plate includes the inlet opening in some embodiments, as discussed and illustrated.

According to another aspect, an exemplary cold plate apparatus comprises a top portion that has an inlet opening through it; and a bottom portion that surrounds an active volume and an inlet plenum at one side of the active volume. The inlet plenum overlaps the inlet opening. Also included is a deflector that protrudes from an outer wall of the inlet plenum toward the active volume. In some cases, the deflector near a bottom surface of the inlet plenum protrudes closer to the inlet opening than does the deflector near a top surface of the inlet plenum. In general, the blocker and deflector are configured as a function of coolant properties and operating conditions (e.g., using computational fluid dynamics as described herein).

In one or more embodiments, the deflector near the bottom surface protrudes further toward the active volume than does the deflector near the top surface (this feature can, in general, be provided separately from, or together with, the feature that the deflector, near a bottom surface of the inlet plenum, protrudes closer to the inlet opening than does the deflector near a top surface of the inlet plenum).

In one or more embodiments, the inlet plenum in normal operation encloses a first region immediately adjacent to the inlet opening, a second region downstream from the first region, and a third region downstream from the second region, and the deflector is in the second region.

One or more embodiments also comprise a blocker that partially separates the inlet plenum from the active volume. The blocker blocks the full height of the plenum opening adjacent the inlet opening and blocks a diminishing portion of the height of the plenum opening proceeding away from the inlet opening along the plenum opening, and the blocker blocks more of the plenum opening near a bottom side of the plenum opening than is blocked near a top side of the plenum opening. In one or more embodiments, the blocker separates the inlet plenum from the active volume across at least ten percent of a segment of the plenum opening, wherein the segment is at least ten percent of the area of the plenum opening.

In one or more embodiments, the bottom portion comprises a bottom plate opposite the top portion and at least one intermediate plate attached between the bottom plate and the top portion, wherein each intermediate plate is between 0.2 and 0.5 millimeter (mm) thick and the interior volume is between 1.5 and 3.0 mm deep.

According to another aspect, an exemplary cold plate apparatus comprises a top plate that has an inlet opening through it; a bottom plate; and a stack of N intermediate plates that are sandwiched between the top and bottom plates and attached to each other and to the top and bottom plates. Each intermediate plate has a central opening. The central openings of the stack of intermediate plates overlap to define an interior volume that is enclosed by the top plate, the bottom plate, and the intermediate plates. The interior volume includes an active volume, an inlet plenum at one side of the active volume, and an inlet opening overlapping the inlet plenum. This aspect also comprises a deflector that protrudes from an outer wall of the inlet plenum toward the active volume. The deflector near the bottom plate protrudes further toward the active volume than does the deflector near the top plate, so that at a lowest intermediate plate the deflector protrudes a distance P from the outer wall of the inlet plenum and at an uppermost intermediate plate the deflector protrudes a second distance P/N from the outer wall of the inlet plenum, and at each intermediate plate ascending from the lowest plate to the uppermost plate, the deflector protrudes P/N less far.

According to another aspect, a cold plate apparatus is constructed by an exemplary process that comprises obtaining an initial cold plate design that includes an active volume, an inlet plenum adjacent to the active volume and connected to the active volume through a plenum opening, and an inlet opening that overlaps the inlet plenum; performing computational fluid dynamics analysis of the initial cold plate design; identifying simulated flow in a first segment of the active volume, proximate the inlet opening, that is greater than simulated flow in a second segment of the active volume, distal from the inlet opening; and generating a revised cold plate design by introducing into the initial cold plate design a blocker that partially separates the inlet plenum from the active volume. The blocker blocks the full height of the plenum opening adjacent the inlet opening and blocks a diminishing portion of the height of the plenum opening proceeding away from the inlet opening along the plenum opening. The blocker blocks more of the plenum opening near a bottom side of the plenum opening than is blocked near a top side of the plenum opening. Further steps include performing computational fluid dynamics analysis of the revised cold plate design; identifying that simulated flow in the first segment and simulated flow in the second segment are within ten percent of a mean flow across the plenum opening; and fabricating the cold plate apparatus according to the revised cold plate design. In one or more embodiments, fabricating the cold plate apparatus comprises building up intermediate layers on top of a bottom plate by additive manufacturing. In one or more embodiments, fabricating the cold plate apparatus comprises bonding intermediate plates onto the bottom plate.

According to another aspect, a method of enhancing flow uniformity through an active volume of a cold plate apparatus comprises introducing coolant into an inlet plenum of the cold plate apparatus through an inlet opening of the cold plate apparatus; blocking a portion of the coolant from flowing into a first segment of the active volume from the inlet plenum, wherein the first segment is proximate to the inlet opening; and deflecting a portion of the coolant to flow into a second segment of the active volume from the inlet plenum, wherein the second segment is downstream from the first segment along the inlet plenum. In one or more embodiments, the coolant is blocked and deflected more near a bottom surface of the inlet plenum that near a top surface of the inlet plenum.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A cold plate apparatus comprising:
walls that surround an active volume adjacent to an inlet plenum, wherein the walls include an inlet opening at one end of a top side of the inlet plenum and a plenum opening between the inlet plenum and the active volume, wherein the walls comprise a top plate, a bottom plate, and a stack of at least three intermediate plates between the top plate and the bottom plate; and
a blocker that partially separates the inlet plenum from the active volume, wherein the blocker is structurally configured to preferentially redirect flow from the inlet plenum into the active volume;
wherein portions of the at least three intermediate plates form a deflector that protrudes from an outer wall of the inlet plenum toward the active volume, and wherein a bottommost of the intermediate plates protrudes further toward the active volume than does a topmost of the intermediate plates.
2. A cold plate apparatus comprising:
walls that surround an active volume adjacent to an inlet plenum, wherein the walls include an inlet opening at one end of a top side of the inlet plenum and a plenum opening between the inlet plenum and the active volume; and a blocker that partially separates the inlet plenum from the active volume, wherein the blocker is structurally configured to preferentially redirect flow from the inlet plenum into the active volume;

wherein the blocker blocks more of the plenum opening near a bottom side of the plenum opening opposite the inlet opening than is blocked near a top side of the plenum opening near the inlet opening;

wherein the blocker comprises a plurality of N fingers extending from the inlet opening along the inlet plenum, a lowest finger being longest and an uppermost finger being shortest; and wherein the lowest finger is a length L, the uppermost finger is a length L/N, and each finger ascending from lowest to uppermost is L/N shorter than a next lower finger.

3. The apparatus of claim 1, wherein the blocker blocks more of the plenum opening near the one end of the inlet plenum than is blocked further from the inlet opening along the inlet plenum.

4. The apparatus of claim 3, wherein the blocker blocks more of the plenum opening near a bottom side of the plenum opening opposite the inlet opening than is blocked near a top side of the plenum opening near the inlet opening.

5. The apparatus of claim 3, wherein the blocker comprises a plurality of fingers extending from a bottom side of the plenum opening toward a top side of the plenum opening, a finger closest to the inlet opening being longest and a finger furthest from the inlet opening being shortest.

6. The apparatus of claim 5, wherein each finger is separated from a neighboring finger by a gap.

7. The apparatus of claim 1, wherein the blocker separates the inlet plenum from the active volume across at least ten percent of a segment of the plenum opening, wherein the segment is at least ten percent of the area of the plenum opening.

8. The apparatus of claim 1, wherein:
the inlet plenum in normal operation encloses a first region immediately adjacent to the inlet opening, a second region downstream from the first region, and a third region downstream from the second region, and
the deflector is in the second region.

9. The apparatus of claim 1, wherein each intermediate plate is between 0.2 and 0.5 millimeter (mm) thick and the interior volume is between 1.5 and 3.0 mm deep.

* * * * *